United States Patent
Parrish et al.

(10) Patent No.: US 7,504,822 B2
(45) Date of Patent: Mar. 17, 2009

(54) AUTOMATIC TESTING EQUIPMENT INSTRUMENT CARD AND PROBE CABLING SYSTEM AND APPARATUS

(75) Inventors: Frank B. Parrish, Simi Valley, CA (US); Arash Behziz, Thousand Oaks, CA (US)

(73) Assignee: Teradyne, Inc., North Reading, MA (US)

( * ) Notice: Subject to any disclaimer, the term of this patent is extended or adjusted under 35 U.S.C. 154(b) by 95 days.

(21) Appl. No.: 11/262,001

(22) Filed: Oct. 28, 2005

(65) Prior Publication Data
US 2007/0096756 A1 May 3, 2007

(51) Int. Cl.
*G01R 31/02* (2006.01)
(52) U.S. Cl. .................... 324/158.1; 324/754
(58) Field of Classification Search ......... 324/754–765, 324/158.1
See application file for complete search history.

(56) References Cited

U.S. PATENT DOCUMENTS

| | | | |
|---|---|---|---|
| 3,560,907 A | 2/1971 | Heller | |
| 3,611,128 A | 10/1971 | Nagata | |
| 4,045,737 A | 8/1977 | Coberly | |
| 4,161,692 A * | 7/1979 | Tarzwell | 324/754 |
| 4,922,191 A | 5/1990 | Conover | |
| 5,386,346 A | 1/1995 | Gleadall | |
| 5,480,721 A * | 1/1996 | Pozzoli et al. | 428/422 |
| 5,821,764 A * | 10/1998 | Slocum et al. | 324/758 |
| 5,973,504 A | 10/1999 | Chiung | |
| 6,091,256 A | 7/2000 | Long et al. | |
| 6,166,553 A | 12/2000 | Sinsheimer | |
| 6,292,005 B1 * | 9/2001 | Suga | 324/754 |
| 6,348,810 B1 | 2/2002 | Yanagawa et al. | |
| 6,420,888 B1 | 7/2002 | Griffin et al. | |
| 6,489,795 B1 | 12/2002 | Klele et al. | |
| 6,617,867 B2 | 9/2003 | Bruno et al. | |
| 6,642,729 B2 * | 11/2003 | Kang et al. | 324/754 |
| 6,972,578 B2 * | 12/2005 | Martens et al. | 324/754 |

(Continued)

FOREIGN PATENT DOCUMENTS

EP    1 584 934 A1    10/2005

(Continued)

OTHER PUBLICATIONS

PCT International Search Report; Date of Mailing Mar. 5, 2007; pp. 1-2.

*Primary Examiner*—Ernest F Karlsen
(74) *Attorney, Agent, or Firm*—Foley & Lardner LLP; Joseph M. Maraia; Ralph Trementozzi

(57) ABSTRACT

A device for interfacing a test head and a prober is disclosed using wires or cables to provide the connection from a probe card interface boards to the probe card. The use of wires or cables, in place of the traditional pogo pin arrangement allows for more reliable and efficient testing, as well as additional high performance tests to be run. Optionally, a probe interface contains a stiffening member with multiple sidewalks and individual, configuration-specific probe card interface strips are connected to a probe card through zero insertion force clamps. The probe card interface attaches to the test head using standard probe interface board ("PIB") docking mechanics. The assembly is then connected to a probe to carry out the testing procedures.

10 Claims, 6 Drawing Sheets

U.S. PATENT DOCUMENTS

| | | |
|---|---|---|
| 6,984,974 B2 | 1/2006 | Liken et al. |
| 6,995,578 B2 | 2/2006 | Shibuya et al. |
| 7,147,499 B1 * | 12/2006 | Mayder et al. ............ 439/260 |
| 7,148,714 B2 * | 12/2006 | Tervo et al. ............... 324/762 |
| 7,230,437 B2 * | 6/2007 | Eldridge et al. ........... 324/754 |
| 7,233,599 B2 | 6/2007 | Deas et al. |
| 7,262,611 B2 * | 8/2007 | Mathieu et al. ............ 324/754 |
| 2002/0063566 A1 | 5/2002 | Bruno et al. |
| 2002/0167328 A1 | 11/2002 | Kister |
| 2003/0027423 A1 | 2/2003 | Zhou et al. |
| 2003/0077932 A1 | 4/2003 | Lewinnek |
| 2006/0006892 A1 | 1/2006 | Green |
| 2007/0096755 A1 | 5/2007 | Parrish et al. |

FOREIGN PATENT DOCUMENTS

| | | |
|---|---|---|
| JP | 2002222839 A | 8/2002 |
| JP | 2005017121 | 1/2005 |
| WO | WO 2006/060467 | 6/2006 |

* cited by examiner

AUTOMATIC TESTING EQUIPMENT INSTRUMENT CARD AND PROBE CABLING SYSTEM AND APPARATUS

FIELD OF THE INVENTION

The present invention relates to automated testing equipment, more specifically a probe interface and method for automatic test equipment.

BACKGROUND OF THE INVENTION

Automatic test equipment ("ATE") has been known in the art for several years. Automating the testing procedures for circuit boards and electronic devices expedites the testing process and allows for greater production of tested electronic devices. When testing an instrument, a probe card or wafer interface is attached to a test head. A probe then docks with the test head through the probe interface using methods well known in the art. The probe interface contains a probe interface board ("PIB") and a probe card. The probe card makes an electrical connection to the PIB through a series of pogo pin, or spring pin, arrangements, typically in the form of a ring. The pogo pin arrangements are limited to 4650 pins per probe card. The PIB is a printed circuit board ("PCB") or a printed wiring board ("PWB") that is pre-designed and manufactured specifically for the instrument to be tested and the test that is to be run. The use of the pogo pin arrangements creates limitations in the accuracy and breadth of the testing capabilities of ATE. The pogo pin configuration is not able to accommodate the full performance capability of the device being tested and can yield unreliable results. Signal transmission though the pogo pin connections is subject to interference and distortion, which can effect test results in the automated environment.

Additionally, to enable different instruments or configurations to be tested, a new PIB and probe card are required with a different circuitry design on the boards. The requirement of producing new boards for every configuration drastically increases the cost of testing and producing electrical devices. The replacement of the PIB and the probe card in the probe card interface is time consuming and expensive.

SUMMARY OF THE INVENTION

Various embodiments of the invention provide for a device for interfacing a test head to a wafer, or device under test. In an illustrative embodiment, high performance wires or cables are used to provide the connection from the probe card interface boards to the probe card. The use of wires or cables, in place of the traditional printed circuit board ("PCB") or printed wiring board ("PWB") arrangements allow for more reliable and efficient testing. A stiffening member may serve as a mounting frame for the device interface boards. The stiffening member may have an internal lattice structure creating a series of open passages that may be used to pass wires or locate circuit components. The stiffening member may have multiple sidewalks and individual, configuration-specific probe card interface strips may be connected to a probe card through low-friction connections such as zero-insertion force clamps or pneumatic connectors. As used herein, the term "sidewalk" is used to refer to each passage row. The probe interface attaches to the test head using standard probe interface board docking mechanics. The assembly is then connected to a prober to carry out the testing procedures.

An example of the present invention modularizes the probe card interface board and its connections, providing for the reconfiguration of testing instruments without the cost of creating entirely new boards for every instrument or test configuration. The probe interface board (PIB) is modularized into a number of probe card interface strips. In this example, the probe card interface strips mount to a stiffening member having multiple sidewalks. The sidewalks may run parallel to a backbone bisecting the length of the stiffening member. The probe card interface strips mount to the backbone and extend perpendicular to the sidewalks. One or more of the probe card interface strips are wired to a zero-insertion force clamp assembly. The clamp assembly engages a probe card by electrically clamping to a connector attached to the probe card.

Various embodiments of the present invention can provide a reliable and configurable testing assembly for automatic test equipment environments. In an illustrative embodiment, the probe card interface has a device interface circuit that communicates with a probe card through a zero-insertion force clamp. The clamp engages an electrical connector that is coupled to the probe card. An embodiment of the present invention also includes a method of testing equipment automatically. In this embodiment, the probe card interface is secured to a test head and wired to communicate with the test head. The probe card is inserted into the probe assembly and connected through the zero-insertion force clamp. A controller on the test head transmits a signal from the test head to the probe assembly and onto the probe card. The probe card may be coupled with wafer probe technology and the device being tested. Data from the test signal is returned through the probe assembly and back to the controller on the test head.

Another embodiment of the present invention includes a stiffening member as a mounting point for the device interface circuit. The stiffening member has a backbone that substantially bisects the stiffening member in to two halves. The stiffening member also has ribs running parallel to the backbone creating open passages for the running of cables of placing of circuitry. In this embodiment, the device interface circuitry is composed of several probe card interface strips that are mounted to the backbone of stiffening member and extend to the outer edge. A probe card having electrical connectors is connected to the interface assembly through the use of zero-insertion force clamps.

In another example embodiment of the invention, a probe card interface is provided having a probe card interface board and at least one electrical coupler configured to couple to a probe card. In this embodiment, a plurality of cables extends between the probe card interface board and the at least one electric coupler.

BRIEF DESCRIPTION OF THE DRAWINGS

The foregoing and other features and advantages of the present invention will be more fully understood from the following detailed description of illustrative embodiments, taken in conjunction with the accompanying drawings in which.

DETAILED DESCRIPTION

Embodiments of the present invention can provide a reliable and cost effective test head/prober interface for automatic test equipment ("ATE"). In some implementations, the present invention can provide increased reliability of the testing procedures. The elimination of pogo pins or spring pins reduces reliability and performance problems experienced in the field. Additionally, the modularization of the device interface circuitry can ease the interchangeability of instruments as well as reducing cost in the manufacture and design of ATE system configurations.

Figure 1:
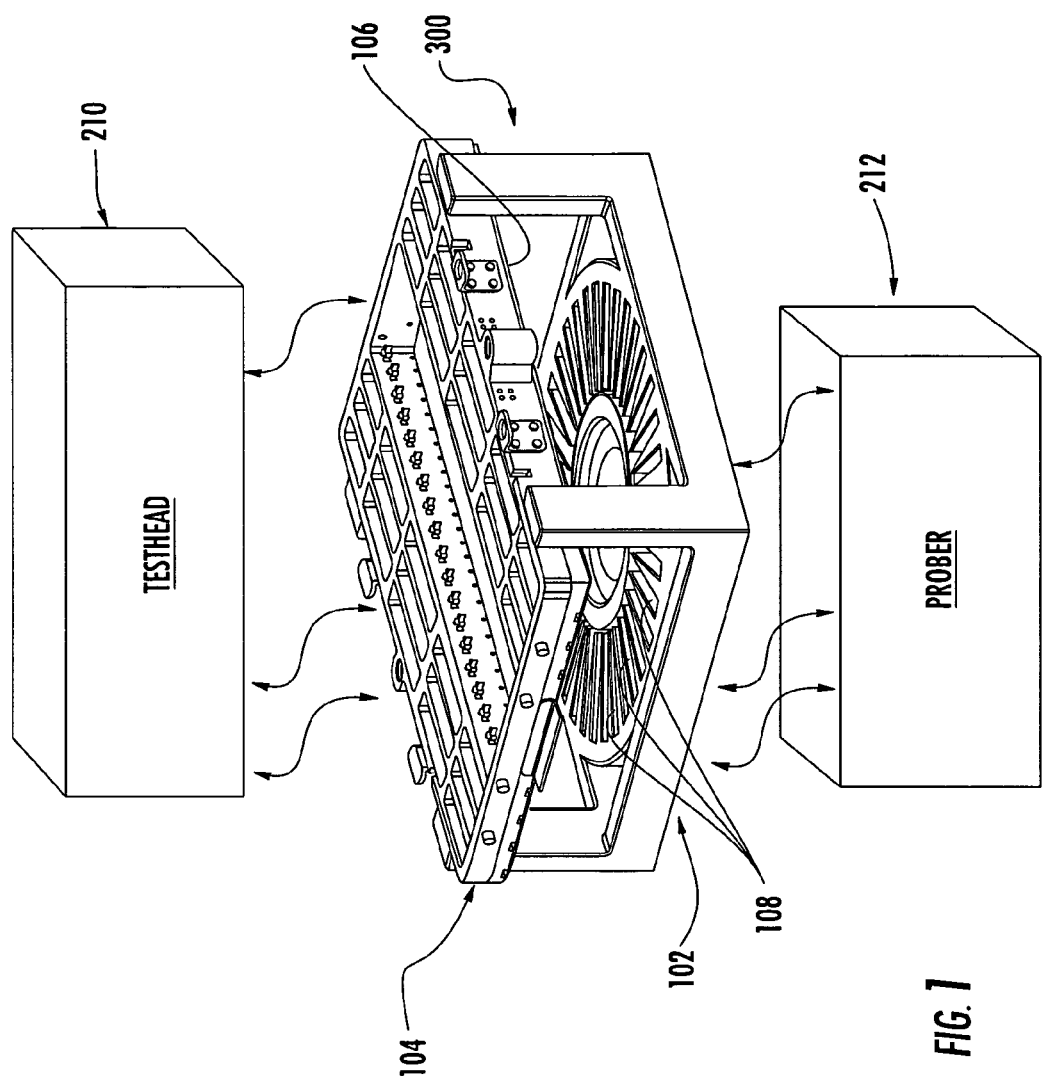
FIG. 1 depicts a partially-exploded perspective view of an automatic test equipment assembly in accordance with an embodiment of the present invention.

Turning now to FIG. 1, a perspective view of an example embodiment of a probe interface 300 is depicted. An assembly frame 102 contains four leg-like structures for the support of a stiffening member 104. The stiffening member 104 securely mounts to the assembly frame 102 through a screw attachment. A probe interface board 106 is mounted to the underside of the stiffening member 104. The probe interface board 106 contains several layers of circuitry that drive the interface of a test head 210 and a prober 212. In the example of FIG. 1, the probe interface board 106 is a single printed circuit board. However, as explained below, the probe interface board 106 can be modularized to facilitate interchangeability of electrical instruments and testing procedures. Assembly frame 102, in this example, contains a platform of radial slits 108 in its base. The radial slits 108 house zero-insertion force clamp assemblies (not shown). The probe interface 300 attaches to the test head 210 using standard docking mechanics. The prober 212 engages the probe interface 300 during the testing procedure.

Although the example depicted above shows an assembly frame 102 with a slot platform in which the slots are spaced in a radial pattern, one skilled in the art should appreciate that any slot pattern which can be configured to engage a probe card with similarly patterned clamp connectors, e.g. parallel rows and columns, star patterned, square, diamond, etc., may be implemented without deviating from the spirit of the invention.

Zero-insertion force clamps are a class of integrated circuit ("IC") sockets which, typically, clamp the IC pins via pneumatic air pressure on the side of the socket after insertion. This class of sockets typically require no downward force on the IC or its pins to insert the connector into the socket. This implementation is very advantageous in applications in which repeated insertions subject the IC or the socket to wear and breakage. Zero-insertion force technology is understood in the art to not require zero insertion force, but typically refers to a structure requiring little to no downward force for insertion.

Figure 2B:
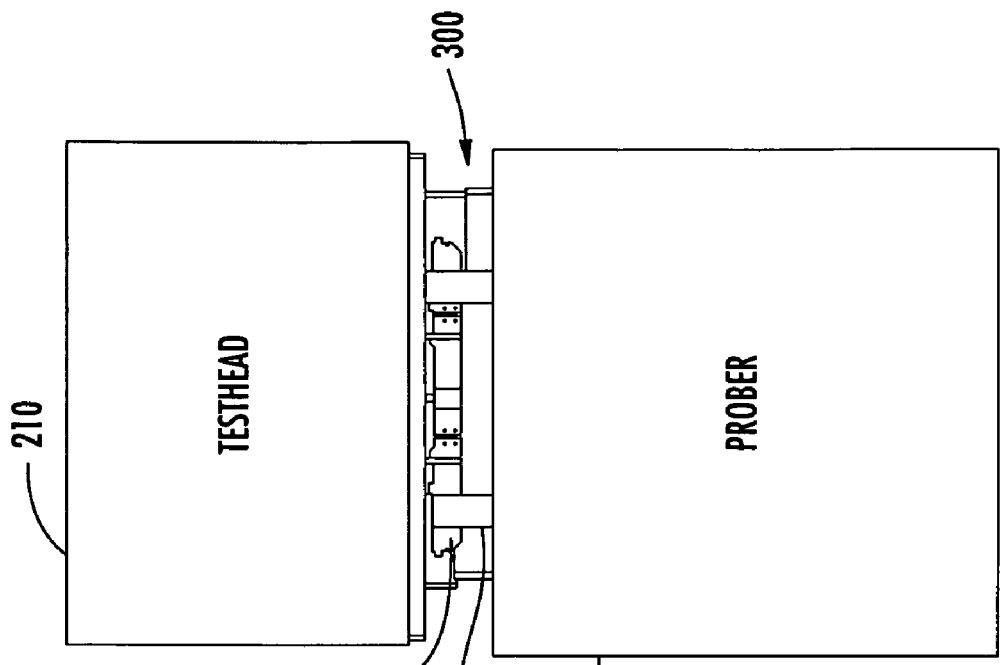
FIGS. 2A-B depict a progression of a docking process of an automatic tester, in accordance with an embodiment of the present invention.
Figure 2A:
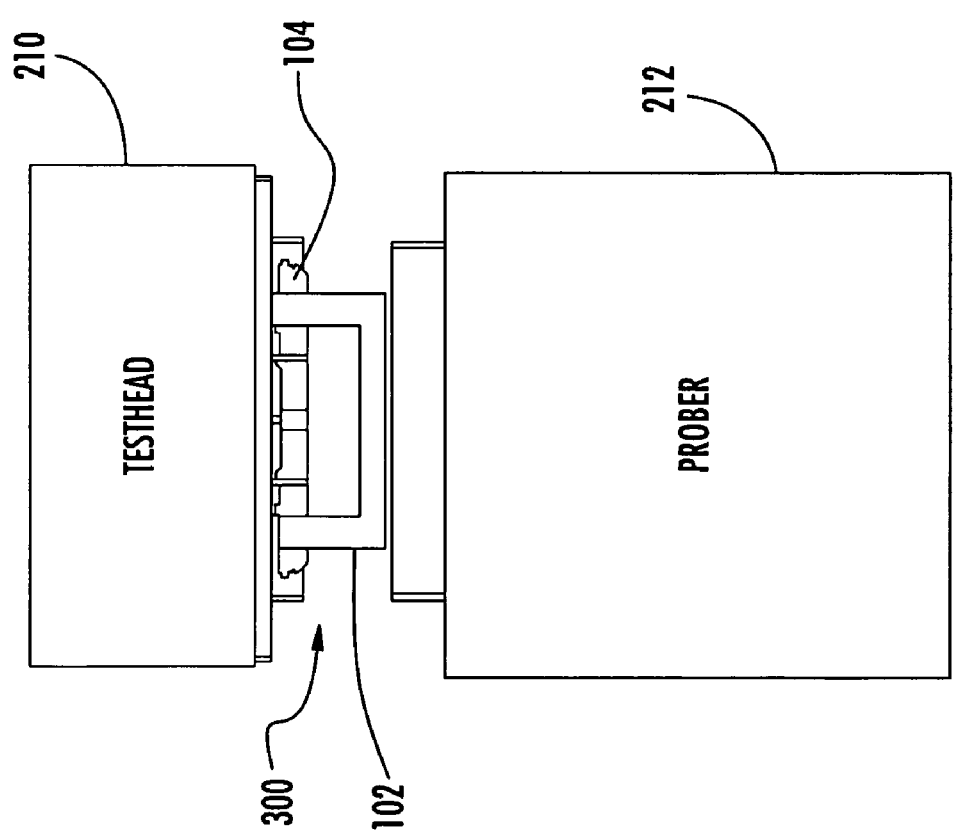

Turning now to FIG. 2A-B, a progression of the docking process between the test head 210 and the prober 212 is shown. FIG. 2A shows the embodiment in a non-engaged state. The probe interface 300 is affixed to the test head 210 in a secure fashion. The stiffening member 104 is attached to the assembly frame 102, which, in turn, is attached to the test head 210. A handler, typically a robotic arm, will engage the test head 210 and probe interface 300 with the prober 212. FIG. 2B shows the test head 210 engaged with the prober 212. Upon engagement, electrical contact is made between the prober 212 and the test head 210 such that the testing process can begin. The stiffening member 104 interfaces directly with the test head 210. A test controller (not shown) will then carry out the testing procedures sending signals from the test head 210 through the probe interface 300 and on to the prober 212. The probe interface 300 creates an interface between test head 210 and the prober 212 allowing them to communicate through electrical signals.

Figure 3:
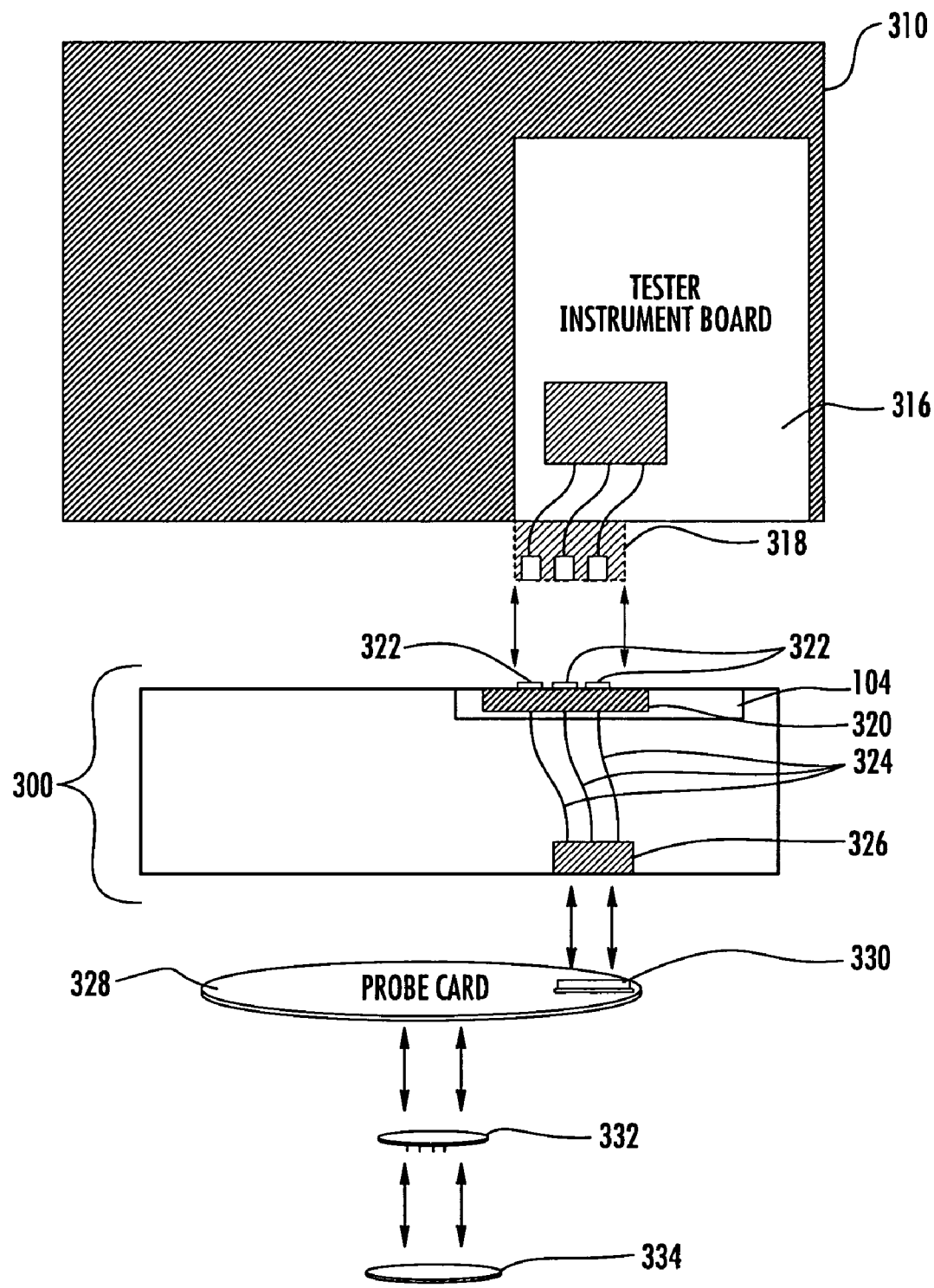
FIG. 3 depicts a system diagram of an automatic tester, in accordance with an embodiment of the present invention.

FIG. 3 depicts a system diagram of the interconnection of the test head 310, probe interface 300 and probe card 328 in accordance with an example of the present invention. The test head 310 contains a tester instrument board 316. The tester instrument board 316 serves as the controller for the test head 310 and directs the testing processes. An instrument interface 318 will communicate with the probe interface 300. The instrument interface 318 is wired to the tester instrument board 316. In this example, the probe interface 300 contains the stiffening member 104 upon which is mounted a plurality of probe card interface strips 320 with individual signal pads 322 to interface with the instrument interface 318. Each signal pad 322 may have a large number of individual electrical connections. The probe card interface strips 320 are connected through a series of wires or cables 324 to a zero-insertion force clamp 326. The use of wires or high performance co-axial cables 324 providing the electrical connections from the probe card interface strip 320 and zero-insertion force clamp 326 replace the traditional pogo pins and provide a much more reliable and comprehensive testing environment. The use of the cables 324 in conjunction with a zero-insertion force clamp 326 alleviates issues related to the application of pressure to the probe card as well as improves the integrity and reliability of the test results.

While the embodiments described herein relate to a probe card interface strip having signal pads capable of several electrical connections, one skilled in the art should recognize that any electrical conductor, e.g. a trace wire, loop-back circuit, integrated circuit, etc., may be implemented without deviating from the scope of the invention.

The traditional pogo pin or spring pin configurations limit the reliability and effectiveness of testing procedures. Any slight jarring to the testing equipment or misalignment of the probe tower or the pogo pins could result in inaccuracies in the test results. Additionally, the pressure required to maintain electrical contact between the pogo pins and the probe card causes wear and stress to the system as well as the probe card.

The probe interface 300 is securely mounted to the test head 310 with the instrument interface 318 in connection with the signal pads 322 of the probe card interface strip 320. The probe interface 300 remains secured to the test head 310. A clamp connector 330 is disposed radially onto a probe card 328. The clamp connector 330 is electrically coupled to the circuitry of the probe card 328. The probe card 328 is electrically coupled to the probe interface 300 and test head 310 through the zero-insertion force clamp 326 receiving the clamp connector 330. The probe card 328 interfaces with the wafer probe technology 332 and the wafer under test 334 through means known in the art. This example illustrates a single probe card interface strip 320 and single clamp connector 330 affixed to the probe card 328. The present invention allows, however, a multitude of configurations and device interface strip/probe card connections. A given instrument, for example, may require several probe card interface strips 320 for adequate testing. In such a case, the appropriate number of probe card interface strips 320 can be utilized in one-to-one correspondence with clamp connectors 330 on the probe card 328, e.g. for every probe card interface strip 320 utilized in the probe interface 300, there may be a similar number of clamp connectors 330 on the probe card 328. The zero-insertion force clamps 326 are located in the slot openings of the radial platform of the assembly frame shown in FIG. 1. In such an example, the clamp connectors 330 are arranged in a radial pattern to fit the arrangement of the zero-insertion force clamps 326 of the probe card interface.

Although the embodiments described herein describe wires or coaxial cables one skilled in the art should recognize that any cable or wire capable of signal transmission, e.g. all axial cables: coaxial, twinax, triax, etc., polyamide cables and derivations thereof, as well as all singulated wire can be used without deviating from the scope of the invention.

Further, one skilled in the art should appreciate that although the examples depicted above show a wire or cable connection between the tester instrument board 316 and the instrument interface 318, any electrical connection method, e.g. a communication board such as a motherboard/daughterboard configuration may be implemented without deviating from the teachings of the invention.

Figure 4:
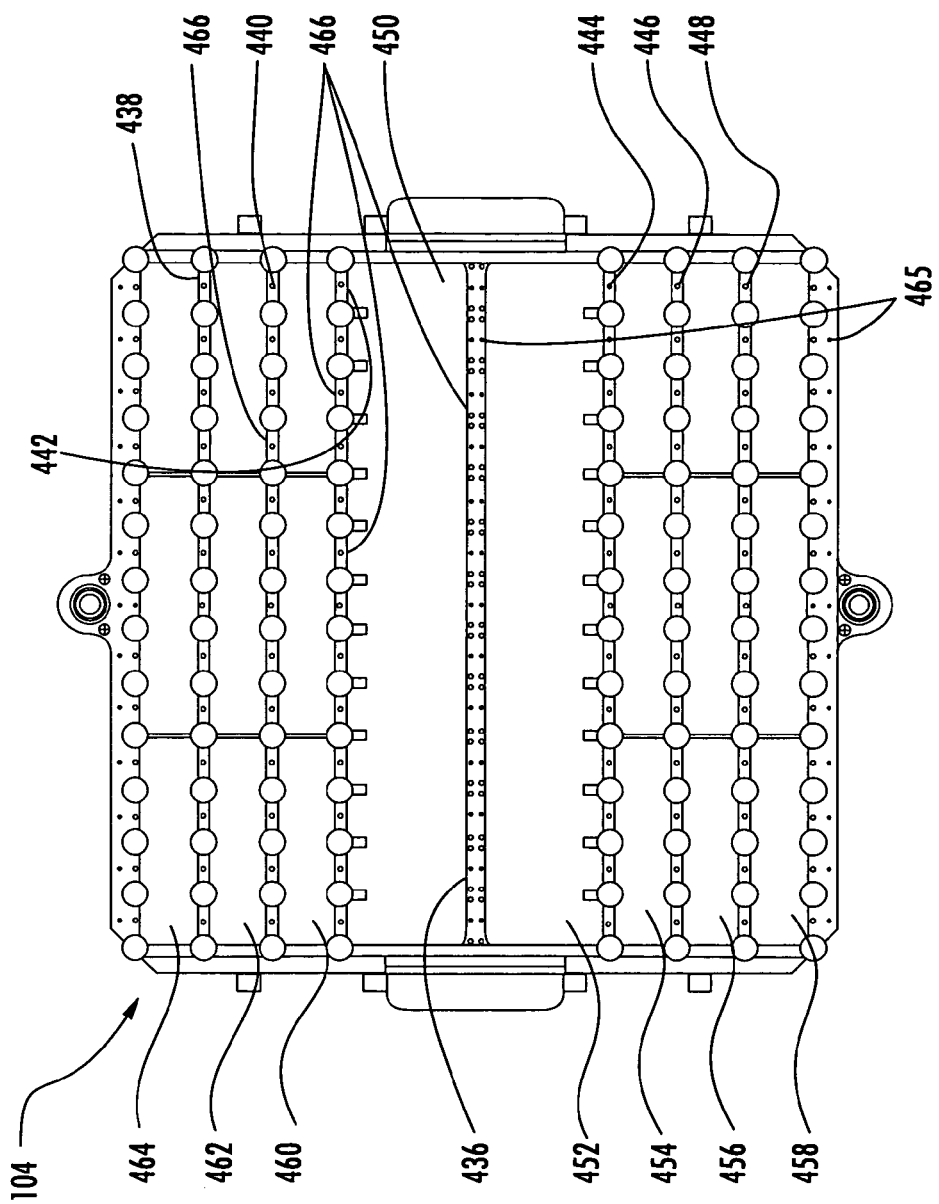
FIG. 4 depicts a top-down view of the stiffening member of the probe interface, in accordance with an embodiment of the present invention.

Turning now to FIG. 4, a top-down view of an example of a stiffening member 104 in accordance with an embodiment of the present invention is shown. The stiffening member 104, in this example, is approximately sixteen inches by sixteen inches square with an internal lattice structure creating a series of open passages that may be used to pass wires or locate circuit components. As used herein, the term "sidewalk" is used to refer to each passage row. The stiffening member 104 has a central backbone 436 and a series of ribs 438-448 running parallel to the backbone 436. The ribs 438-448 of the stiffening member 104 create sidewalks for the segmentation of the signal pads of the probe interface circuitry. The device interface strip may be supported by pads on each rib when affixed to the stiffening member.

Moving from the backbone outward toward each side of the stiffening member 104, sidewalk one 450, 452 is the row defined by the backbone 436 and the first rib 442, 444 to either side of the backbone 436. Sidewalk one 450, 452 is typically reserved for high performance instruments. The signal pads on the probe interface board, or strips, for these high performance instruments overlap the area defined as sidewalk one. Sidewalk two 454, 460 is defined by the next outer ribs 440, 446; sidewalk three 456, 462 is defined by the next outer ribs 438, 448; and sidewalk four 458, 464 is defined by the outer ribs 438, 448 and the outer edge of the stiffening member 104. The circuitry in the probe card interface is designed such that the circuitry of the instruments with the highest performance are disposed closest to the center and the circuitry of the lowest performance instruments is to the outer sidewalk four 458, 464. The backbone 436 and the ribs 438-448 have mounting holes 466 for mounting the probe card interface strips. Alignment pins 465 are located around the outer edge of the stiffening member 104 and the backbone 436 to help align the probe card interface strips with the mounting holes 466 and sidewalks 450-464.

Figure 5:
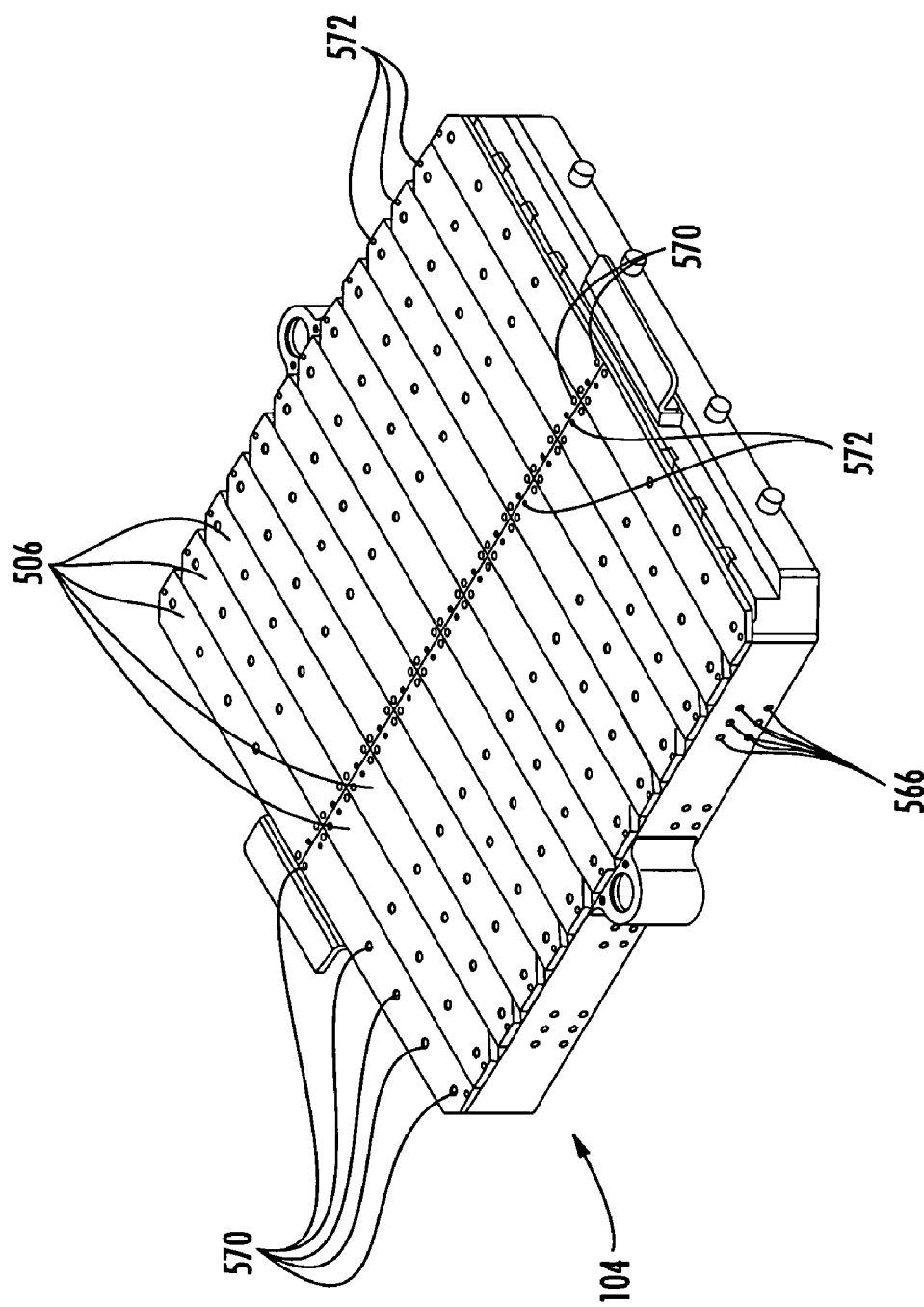
FIG. 5 is a perspective view of the probe card interface strips mounted on the stiffening member in accordance with an embodiment of the present invention.

Turning now to FIG. 5, a perspective view of the stiffening member 104 is shown with the probe card interface strips 506 mounted to the stiffening member. In the illustrative example the sixteen inch by sixteen inch square stiffening member can accommodate twenty-six distinct probe card interface strips 506. Each probe card interface strip 506 may contain six mounting holes 570 for affixing to the stiffening member: four holes down the length of the probe card interface strip 506 for attachment to the ribs of the stiffening member 104 and two holes at the end of the probe card interface strip 506 for attachment to the backbone. The probe card interface strips 506 contain alignment holes 572 at both ends of the strip to receive the alignment pins of the stiffening member 104. After the probe card interface strips 506 are aligned with the alignment pins 572, screws are used to secure the probe card interface strips 506 to the stiffening member 104. The area of the probe card interface strips 506 between each of the mounting holes 570 correspond to the sidewalk arrangement of the stiffening member 104, e.g. sidewalk one application circuitry on the probe card interface strip 506 is disposed between the two backbone mounting holes and the mounting hole for the next rib outward, sidewalk two application circuitry is disposed between the first and second mounting holes, sidewalk three application circuitry is disposed between the second and third mounting holes and sidewalk four application circuitry is disposed between the third and fourth mounting holes. The stiffening member 104 also has frame mounting holes 566 along the outer edge to securely attach the stiffening member 104 to the interface frame.

The probe card interface strips 506 represent the modularization of the traditional probe interface boards common in the art. Traditional ATE probe assemblies required the design, manufacture and installation of distinct probe interface boards for every instrument tested and every configuration used. A typical probe interface board consists of 20-40 layers of complex semiconductor technology, requiring substantial cost and time to produce. Traditional replacement of a probe interface board is a costly exercise in both time and money. Embodiments of the present invention can provide for complete modularization of the probe interface board. Segmenting the board into strips allows for easy interchangeability and configuration of the probe card interface. Replacement of a testing device requires only a change to the corresponding probe card interface strip 506 instead of replacing the entire probe interface board. The addition, removal or substitution of a probe card interface strip 506 can be accomplished by the removal of the fastening structure, six mounting screws in the illustrative embodiment, replacing the strip with the desired strip, and re-fastening the mounting screws. Additionally, the manufacture of the probe card interface strips 506 involve only a fraction of the cost and time of an entire probe interface board.

Alternative embodiments of probe card interface strips can have at least one conductive edge. For example, a probe card interface strips can have one or two conductive edges. Conductive edges may be formed by a wide variety of methods, such as, but not limited to, plating the edge with copper, nicked or gold. A conductive grounding insert may be placed between two conductive edges to provide an electrically conductive path between neighboring probe card interface strips. Examples of conductive grounding inserts can include, but are not limited to, a conductive foil and a flexible corrugated metal sheet or film. In one example, the grounding insert can provide a ground path between neighboring probe card interface strips.

While the embodiments described herein contain a substantially rectangular stiffening member with parallel ribs extending the length of the stiffening member, one skilled in the art should appreciate that any shape, e.g., circular, oval, cross, pentagonal, etc. stiffening member may be implemented without deviating from the scope of the invention.

Additionally, while the illustrative embodiments contain a backbone and ribs that extend the length of the rectangular stiffening member and are substantially parallel to each other, one skilled in the art should recognize that any arrangement of the backbone, e.g. circular ring, rectangular center, etc., and ribs, e.g. radial, non-parallel, skewed, cross-hatch, concentric rings, concentric rectangles, etc., may be implemented without deviating from the scope of the invention. Also, while a single backbone is illustrated, one skilled in the art should recognize that any number of backbones may be implemented without deviating from the scope of the present invention.

While the examples explained above depict a sixteen by sixteen inch square, 24 slot stiffening member, one skilled in the art should recognize that any size stiffening member or number of slots commonly used in the art without deviating from the teachings of the present invention.

Although the examples explained above detail screw attachments and engagements between the components of the system, one skilled in the art should recognize that any method of securely fastening the components together, e.g. snap fit, clamp fit, button fit, etc., does not deviate from the scope of the present invention.

Further, while the examples depicted above show probe card interface strips with alignment holes centered at the ends of the strip, one skilled in the art should appreciate any alignment pattern or number of mounting holes, such as off-centered alignment holes, may be implemented without deviating from the spirit of the invention.

Although the examples illustrated above depict the probe card interface strips as having six mounting holes (two at one end, and 4 along the length of the strip), one skilled in the art should appreciate any number of mounting holes and alignments, for example, 10 holes: 2 at one end of the strip and pairs of two mounting holes along the length of the strip, may be utilized without deviating from the spirit of the invention.

Although the description of the illustrative examples above depict a modularized configuration using probe card interface strips, one skilled in the art should recognize that any probe interface board/strip configuration may be implemented, e.g., a single probe interface board, or multiple probe card interface strips, or any combination thereof, may be used without deviating from the teachings of the invention. Also, no mounting holes may be used.

Figure 6:
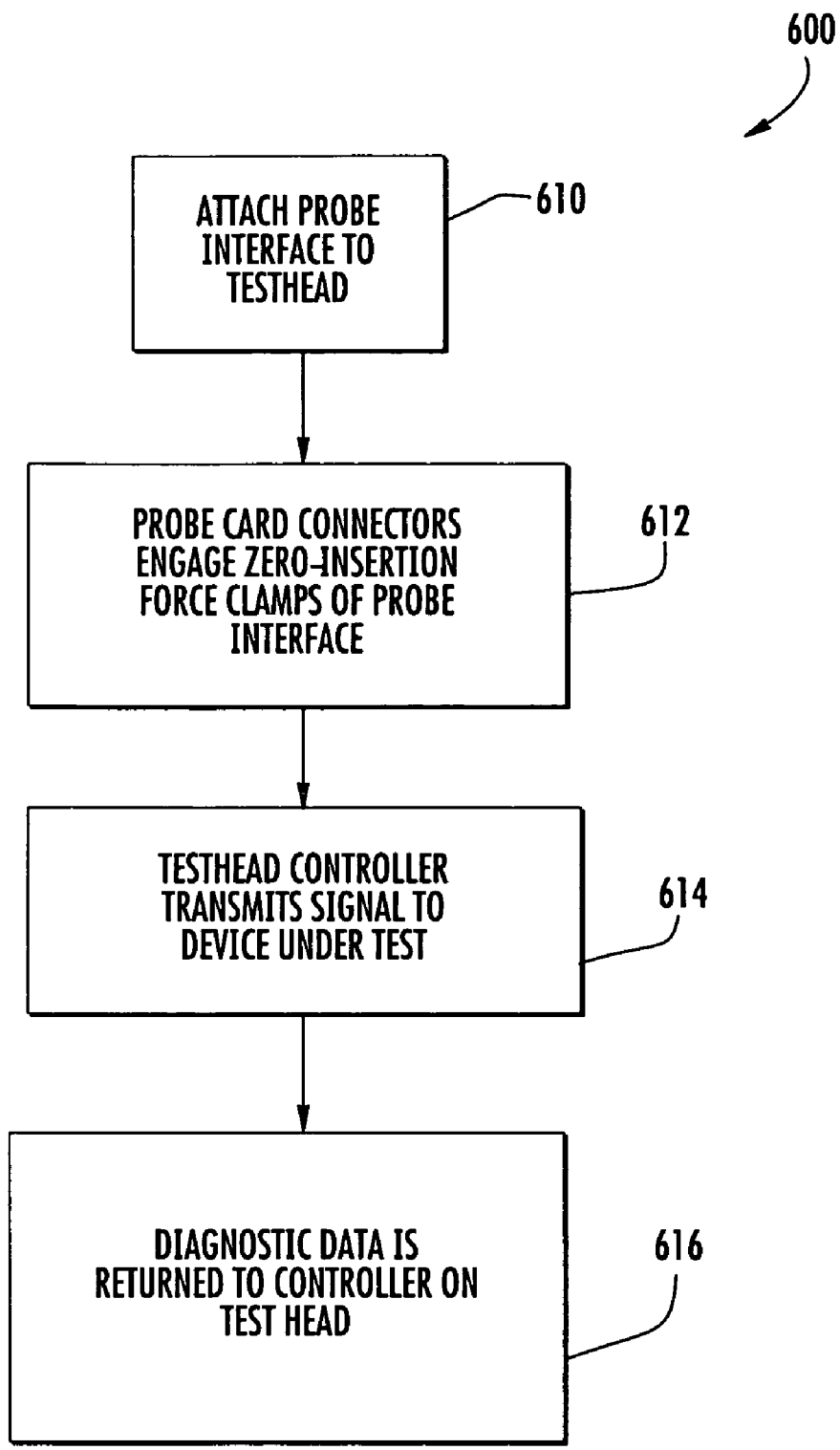
FIG. 6 depicts a flow diagram of a testing process in accordance with an embodiment of the invention.

Turning now to FIG. 6, a flow diagram of a testing process 600 in accordance with an embodiment of the invention is illustrated. The probe card interface is securely attached 610 to the test head. The probe assembly remains attached to the test head throughout the testing procedure. A handler then engages 612 the probe card connectors attached to the probe card with the zero-insertion force clamps. The zero insertion force clamps are closed around the electrical contacts of the probe card connectors, electrically coupling the test head to the probe card through the probe card interface. The controller from the instrument board on the test head then transmits 614 a signal through the probe assembly and onto the probe card. The probe card is electrically coupled with the wafer probe technology and the device under test through means common in the art. Diagnostic data is then returned 616 to the controller on the instrument board of the test head for storing or processing of test data.

The present application incorporates by reference in its entirety, the application entitled Method and Apparatus for Automatic Test Equipment, U.S. Ser. No. 11/261,962, filed on even date herewith.

In addition to the description of specific, non-limited examples of embodiments of the invention provided herein, it should be appreciated that the invention can be implemented in numerous other applications involving the configurations of ATE. Although the invention is described hereinbefore with respect to illustrative embodiments thereof, it will be appreciated that the foregoing and various other changes, omissions and additions in the form and detail thereof may be made without departing from the spirit and scope of the invention.

What is claimed is:

1. A probe interface comprising:
   a stiffening member;
   a plurality of probe card interface strips, each of the strips having at least one electrical component and affixed to the stiffening member;
   a probe card having at least one electrical connector;
   a plurality of zero-insertion force clamps, each of the zero-insertion force clamps in electrical communication with at least one of the probe card interface strips, and engaging the at least one electrical connector of the probe card; and
   at least one cable, electrically coupling at least one zero-insertion force clamp of the plurality of zero-insertion force clamps and at least one probe card interface strip.

2. The probe interface of claim 1, further comprising a frame affixed to the stiffening member, the frame defining at least one slot, the at least one zero-insertion force clamp disposed in the at least one slot of the frame.

3. The probe interface of claim 2, wherein the at least one slot comprises a ring of radial slots and the at least one electrical connector is disposed on the probe card radially.

4. The probe interface of claim 1, wherein the cable comprises a coaxial cable.

5. The probe interface of claim 1, wherein the cable comprises a polyamide cable.

6. The probe interface of claim 1, wherein the plurality of probe card interface strips are affixed to a backbone of the stiffening member.

7. The probe interface of claim 1, wherein the electrical component is an integrated circuit.

8. The probe interface of claim 1, wherein the electrical component is a trace.

9. The probe interface of claim 1, wherein each of the probe card interface strips further comprises a plurality of signal pads.

10. The probe interface of claim 1, wherein each probe card interface strip has a one-to-one correspondence with a zero-insertion force clamp.

* * * * *